US012575097B2

(12) United States Patent
 Goh

(10) Patent No.: US 12,575,097 B2
(45) Date of Patent: Mar. 10, 2026

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventor: Han Na Goh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 672 days.

(21) Appl. No.: 17/942,423

(22) Filed: Sep. 12, 2022

(65) Prior Publication Data

US 2023/0292501 A1 Sep. 14, 2023

(30) Foreign Application Priority Data

Mar. 14, 2022 (KR) ......................... 10-2022-0031399

(51) Int. Cl.
 *H10B 41/27* (2023.01)
 *H01L 23/522* (2006.01)
 *H01L 23/528* (2006.01)
 *H10B 41/10* (2023.01)
 *H10B 43/10* (2023.01)
 *H10B 43/27* (2023.01)

(52) U.S. Cl.
 CPC ......... *H10B 41/27* (2023.02); *H01L 23/5226* (2013.01); *H01L 23/5283* (2013.01); *H10B 41/10* (2023.02); *H10B 43/10* (2023.02); *H10B 43/27* (2023.02)

(58) Field of Classification Search
 CPC ........ H10B 41/27; H10B 41/10; H10B 42/10; H10B 43/27; H10B 43/30; H10B 43/40; H10B 43/50; H01L 23/5226; H01L 23/5283
 See application file for complete search history.

(56) References Cited

U.S. PATENT DOCUMENTS

| | | | | |
|---|---|---|---|---|
| 9,601,508 | B2* | 3/2017 | Sel ........................ | H10D 30/683 |
| 2016/0086963 | A1* | 3/2016 | Cernea ................... | H10B 41/27 |
| | | | | 438/259 |
| 2017/0338241 | A1* | 11/2017 | Lee ........................ | H10B 43/35 |
| 2019/0103415 | A1* | 4/2019 | Xiao ................. | H01L 21/76883 |
| 2020/0168622 | A1 | 5/2020 | Fukuzumi et al. | |
| 2020/0312861 | A1* | 10/2020 | Kim .................... | H10D 62/151 |
| 2020/0381447 | A1* | 12/2020 | Kim ........................ | H10B 43/27 |

FOREIGN PATENT DOCUMENTS

KR 1020170131945 A 12/2017

* cited by examiner

*Primary Examiner* — Galina G Yushina
(74) *Attorney, Agent, or Firm* — WILLIAM PARK AND ASSOCIATES LTD.

(57) ABSTRACT

The present technology includes a semiconductor memory device. The semiconductor memory device includes a source stack, a capacitor electrode including a metal layer buried in the source stack, a stack including first insulating layers and second insulating layers alternately stacked on the source stack, and a contact plug passing through the stack and extending to be connected to the metal layer.

20 Claims, 18 Drawing Sheets

SIL

SEMICONDUCTOR MEMORY DEVICE AND METHOD OF MANUFACTURING THE SEMICONDUCTOR MEMORY DEVICE

CROSS-REFERENCE TO RELATED APPLICATION

The present application claims priority under 35 U.S.C. § 119(a) to Korean patent application number 10-2022-0031399, filed on Mar. 14, 2022, in the Korean Intellectual Property Office, the entire disclosure of which is incorporated herein by reference.

BACKGROUND

1. Technical Field

The present disclosure relates to a method of manufacturing a semiconductor memory device, and more particularly, to a method of manufacturing a three-dimensional semiconductor memory device.

2. Related Art

A nonvolatile memory element is a memory element in which stored data is maintained even though power supply is cut off. Recently, as improvement of an integration degree of a two-dimensional nonvolatile memory element that forms a memory cell in a single layer on a substrate has reached a limit, a three-dimensional nonvolatile memory element that vertically stacks memory cells on a substrate has been proposed.

The three-dimensional nonvolatile memory element includes insulating layers and gate electrodes which are alternately stacked, and channel layers passing through the insulating layers and the gate electrodes, and memory cells are stacked along the channel layers. Various structures and manufacturing methods have been developed to improve reliability of the nonvolatile memory element having such a three-dimensional structure.

SUMMARY

According to an embodiment of the present disclosure, a semiconductor memory device may include a source stack, a capacitor electrode including a metal layer buried in the source stack, a stack including first insulating layers and second insulating layers alternately stacked on the source stack, and a contact plug passing through the stack and extending to be connected to the metal layer.

According to an embodiment of the present disclosure, a semiconductor memory device may include a first structure including a cell source stack and a source stack disposed on the same level and formed in different stack structures, a second structure including a cell stack and a stack spaced apart from each other, and disposed on the first structure, a capacitor electrode including a metal layer passing through a portion of the source stack, and a contact plug passing through the stack and electrically connected to the metal layer.

According to an embodiment of the present disclosure, a semiconductor memory device may include an interlayer source conductive layer, a second source conductive layer disposed on the interlayer source conductive layer, a cell etch stop pattern passing through the second source conductive layer, a cell stack including conductive layers and interlayer insulating layers alternately disposed on the source conductive layer, a slit passing through the cell stack and the cell etch stop pattern, a first capacitor electrode and a second capacitor electrode disposed on the same level as the cell etch stop pattern, the first capacitor electrode spaced apart from the second capacitor electrode, a stack including first insulating layers and second insulating layers alternately disposed on the first capacitor electrode and the second capacitor electrode, and a first contact plug and a second contact plug passing through the stack and respectively connected to the first capacitor electrode and the second capacitor electrode.

According to an embodiment of the present disclosure, a method of manufacturing a semiconductor memory device may include forming a source stack, forming a trench passing through an upper portion of the source stack, forming a capacitor electrode inside the trench, alternately stacking first material layers and second material layers on the source stack, and forming a contact plug passing through the first material layers and the second material layers and connected to the capacitor electrode.

According to an embodiment of the present disclosure, a method of manufacturing a semiconductor memory device may include forming a lower stack including a first source conductive layer, a source sacrificial layer on the first source conductive layer, and a second source conductive layer on the source sacrificial layer, separating the lower stack into a preliminary cell source stack and a source stack, forming a trench passing through the second source conductive layer of the source stack and a cell trench passing through the second source conductive layer of the preliminary cell source stack, forming a cell etch stop pattern inside the cell trench while forming a capacitor electrode inside the trench, alternately stacking a plurality of first material layers and a plurality of second material layers on the preliminary cell source stack and the source stack, and forming a contact plug passing through the plurality of first material layers and the plurality of second material layers and connected to the capacitor electrode.

BRIEF DESCRIPTION OF THE DRAWINGS

FIGS. 3A and 3B are cross-sectional views illustrating a semiconductor memory device according to an embodiment of the present disclosure taken along a line I-I' and a line II-II' shown in FIG. 2.

FIGS. 4A, 4B, 5A, 5B, 6A, 6B, 7, 8, 9, 10A, 10B, 11, 12, 13, and 14 are cross-sectional views illustrating a method of manufacturing a semiconductor memory device according to an embodiment of the present disclosure.

DETAILED DESCRIPTION

Specific structural or functional descriptions of the embodiments according to the concept of the present disclosure disclosed in the present specification or application are exemplified to describe the embodiments according to the concept of the present disclosure. The embodiments according to the concept of the present disclosure are not to be construed as being limited to the embodiments described in the present specification or application, and may be implemented in various forms.

In an embodiment of the present disclosure, terms such as first and second may be used to describe various components, but the components are not limited by the terms. The terms are used for the purpose of distinguishing one component from another component. For example, a first component may be referred to as a second component, and similarly, a second component may also be referred to as a first component without departing from the scope of rights according to the concept of the present disclosure. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers present.

An embodiment of the present disclosure provides a semiconductor memory device and a method of manufacturing the same having an easy manufacturing process, a stable structure, and an improved characteristic.

According to an embodiment, an operation characteristic of the semiconductor memory device may be improved by a capacitor increase, by forming the capacitor electrode on the source stack. In addition, in an embodiment, cost of a manufacturing process may be reduced, by providing the capacitor electrode using a cell etch stop pattern forming process.

Figure 1:
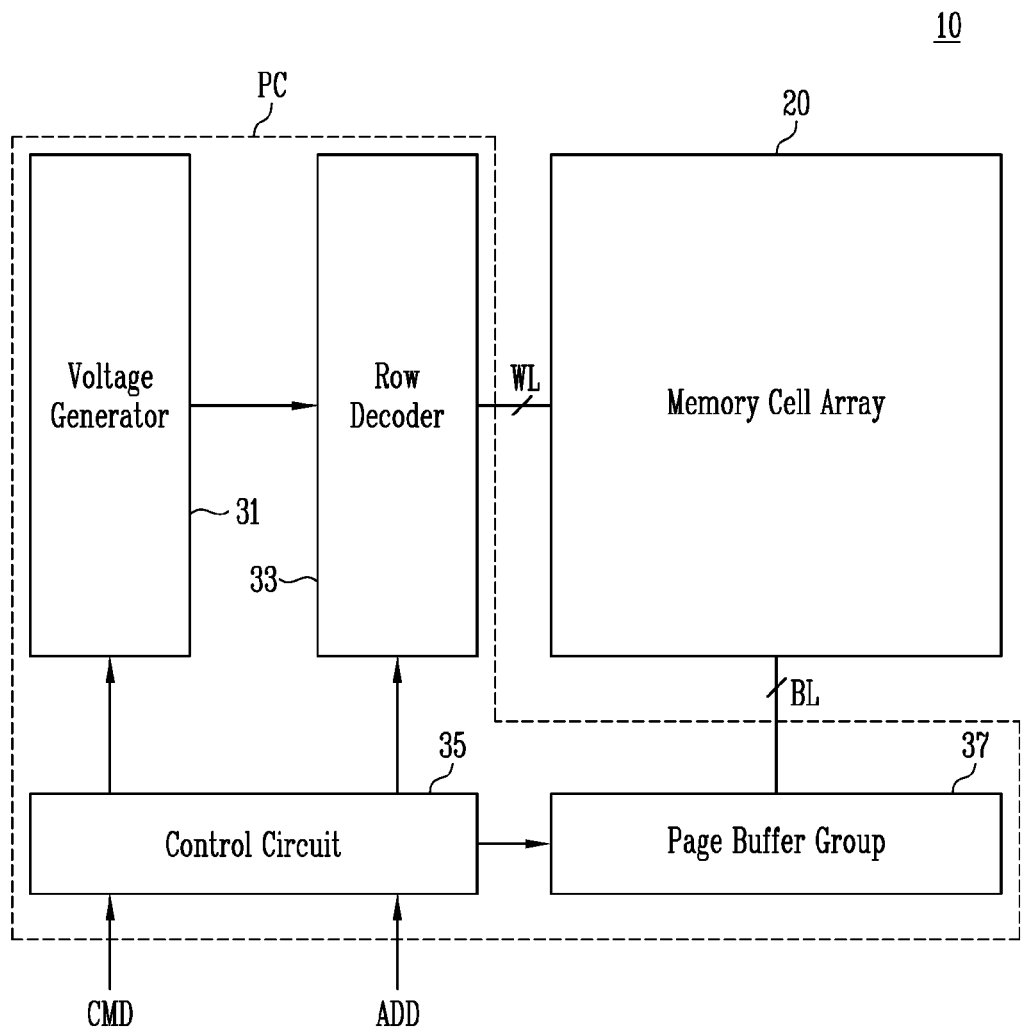
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 10 includes a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20.

As an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL, and may be connected to the page buffer group 37 through bit lines BL.

The control circuit 35 may control the peripheral circuit PC in response to a command CMD and an address ADD.

The voltage generator 31 may generate various operation voltages such as a pre-erase voltage, an erase voltage, a ground voltage, a program voltage, a verify voltage, a pass voltage, and a read voltage used for the program operation, the read operation, and the erase operation in response to control of the control logic 35.

The row decoder 33 may select a memory block in response to the control of the control circuit 35. The row decoder 33 may be configured to apply the operation voltages to the word lines WL connected to the selected memory block.

The page buffer group 37 may be connected to the memory cell array 20 through the bit lines BL. The page buffer group 37 may temporarily store data received from an input/output circuit (not shown) during the program operation in response to the control of the control circuit 35. The page buffer group 37 may sense a voltage or a current of the bit lines BL during the read operation or a verify operation in response to the control of the control circuit 35. The page buffer group 37 may select the bit lines BL in response to the control of the control circuit 35.

Structurally, the memory cell array 20 may overlap a portion of the peripheral circuit PC.

Figure 2:
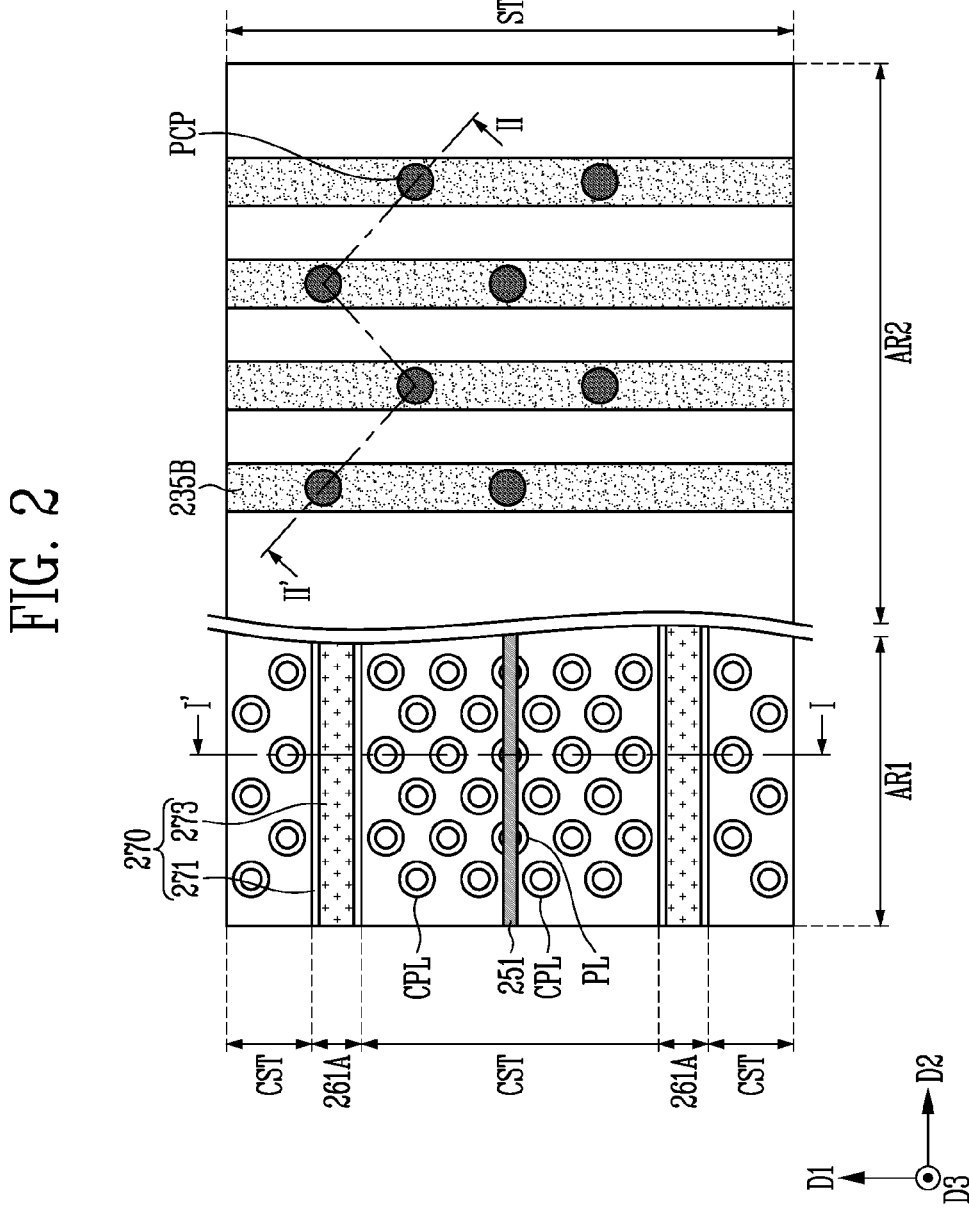
FIG. 2 is a plan view illustrating a portion of a memory cell array according to an embodiment of the present disclosure.

FIG. 2 is a plan view illustrating a portion of a semiconductor memory device according to an embodiment of the present disclosure.

Referring to FIG. 2, the semiconductor memory device may include a first area AR1 in which a memory cell array is disposed and a second area AR2 in which a capacitor is disposed. The semiconductor memory device may include a cell stack CST disposed in the first area AR1, a stack ST disposed in the second area AR2, a cell source stack 260 of FIG. 3A disposed under the cell stack CST, and a source stack 300b of FIG. 3B disposed under the stack ST.

The cell stack CST may be penetrated by a slit 261A. The cell stack CST may include a plurality of layers extending in a first direction D1 and a second direction D2. The plurality of layers may be stacked in a third direction D3. The first direction D1, the second direction D2, and the third direction D3 may be defined as directions in which axes crossing each other face. For example, the first direction D1, the second direction D2, and the third direction D3 may correspond to directions in which an X-axis, a Y-axis, and a Z-axis of an XYZ coordinate system face, respectively.

A gate isolation structure 251 may be buried in the cell stack CST. The gate isolation structure 251 may extend in parallel to the slit 261A. As an embodiment, the gate isolation structure 251 may extend in the second direction D2.

A plurality of cell plugs CPL may be disposed on both sides of the gate isolation structure 251. The plurality of cell plugs CPL may extend in the third direction D3 to pass through a cell array area of the cell stack CST.

The cell stack CST may be penetrated by a plurality of plugs PL arranged in a line along an extension direction of the gate isolation structure 251. The gate isolation structure 251 may extend into each plug PL.

The slit 261A may be filled with a vertical structure 270. The vertical structure 270 may include a conductive source contact 273 and a spacer insulating layer 271 surrounding a sidewall of the conductive source contact 273. The conductive source contact 273 may include at least one of a doped semiconductor layer, a metal silicide layer, a metal barrier layer, and a metal layer. Although not shown in the drawing, as an embodiment, the vertical structure 270 may be formed of an insulating material filling the slit 261A.

The semiconductor memory device may include two or more capacitor electrodes 235B disposed under the stack ST. The capacitor electrodes 235B may be disposed to be spaced apart from each other. A capacitor may be defined by adjacent capacitor electrodes 235B. The capacitor electrodes 235B may be connected to a plurality of contact plugs PCP. The plurality of contact plugs PCP may pass through the stack ST in the second area AR2. The plurality of contact plugs PCP may be disposed in a zigzag shape. An embodiment of the present disclosure is not limited thereto.

Figure 3A:
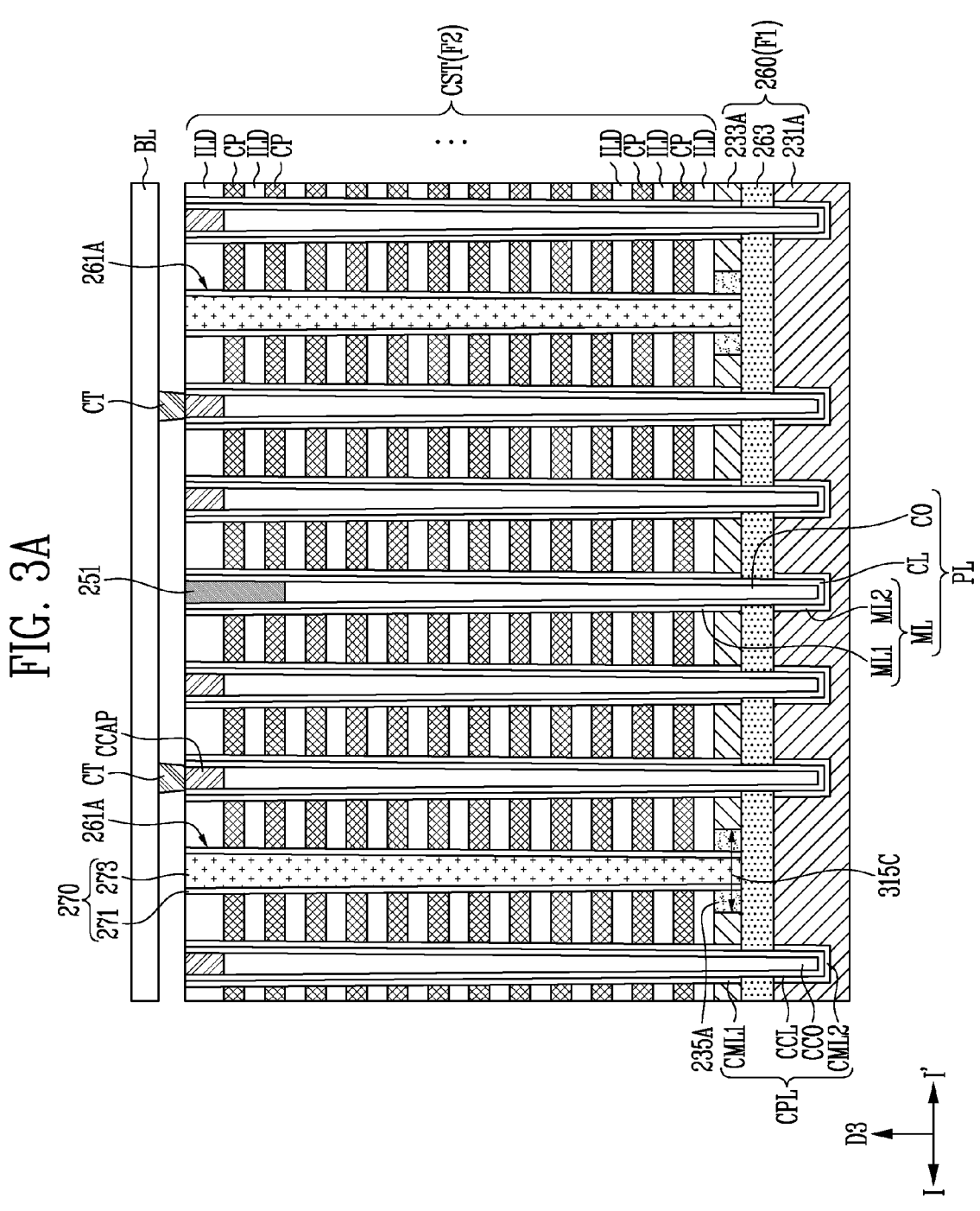
Figure 3B:
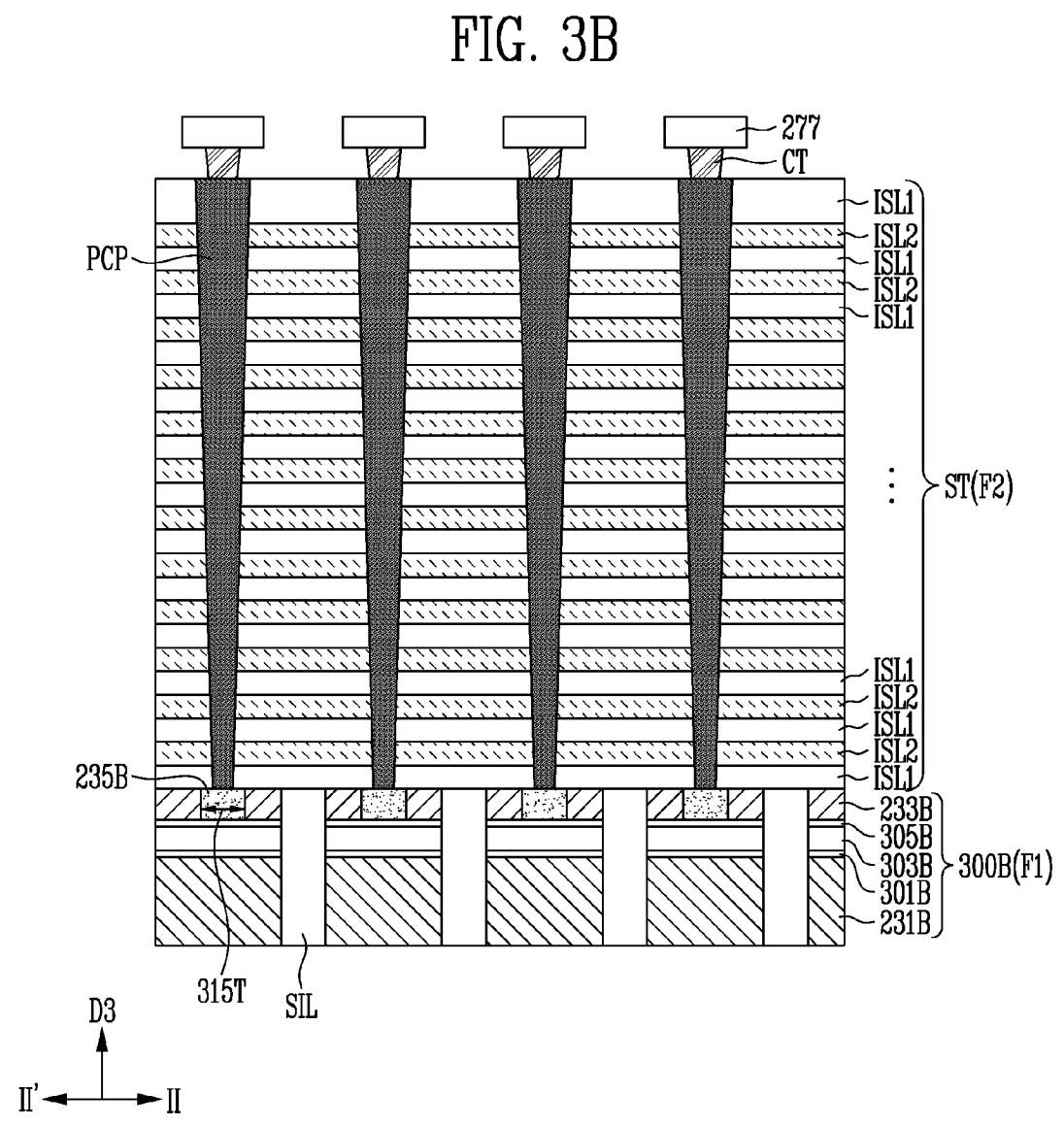

FIGS. 3A and 3B are cross-sectional views illustrating a semiconductor memory device according to an embodiment of the present disclosure taken along a line I-I' and a line II-II' shown in FIG. 2.

FIG. 3A is a cross-sectional view taken along the line I-I' of the first area AR1 of the semiconductor memory device. FIG. 3B is a cross-sectional view taken along the line II-II' of the second area AR2 of the semiconductor memory device.

Referring to FIG. 3A, the cell source stack 260 may include a cell trench 315C. The cell trench 315C may be a line type extending in one direction. As an embodiment, the cell trench 315C may extend in the second direction D2. The cell source stack 260 may include a doped semiconductor layer. As an embodiment, the cell source stack 260 may include a stack structure of a first source conductive layer 231A, an interlayer source conductive layer 263, and a second source conductive layer 233A. Each of the first source conductive layer 231A, the interlayer source conductive layer 263, and the second source conductive layer 233A may be a doped semiconductor layer and may include at least one of an n-type impurity and a p-type impurity. The second source conductive layer 233A may overlap the cell trench 315C. The second source conductive layer 233A may be disposed on the first source conductive layer 231A and may be penetrated by the cell trench 315C. The interlayer source conductive layer 263 may be disposed between the first source conductive layer 231A and the second source conductive layer 233A. A cell etch stop pattern 235A may be disposed inside the cell trench 315C.

The cell stack CST may be disposed on the cell source stack 260. The cell stack CST may include interlayer insulating layers ILD and conductive layers CP alternately stacked in the third direction D3.

The interlayer insulating layers ILD may include an insulating material. As an embodiment, the interlayer insulating layers ILD may include an oxide. The conductive layers CP may include at least one of a doped silicon layer, a metal silicide layer, tungsten, nickel, and cobalt. The conductive layers CP may be used as a word line connected to a memory cell or a select line connected to a select transistor.

The cell stack CST, the second source conductive layer 233A, the interlayer source conductive layer 263, and the first source conductive layer 231A may be penetrated by the cell plugs CPL. The cell plugs CPL may pass through the interlayer insulating layers ILD and the conductive layers CP of the cell stack CST. The cell plugs CPL may extend in the third direction D3. A lowermost portion of the cell plugs CPL may be disposed in the first source conductive layer 231A. The cell plugs CPL may be electrically connected to the interlayer source conductive layer 263 of the cell source stack 260.

Each of the cell plugs CPL may be disposed inside a channel hole. The channel hole may pass through the cell stack CST, the second source conductive layer 233A, and the interlayer source conductive layer 263, and may extend into the first source conductive layer 231A. The cell plug CPL may include a cell memory layer CML, a cell channel layer CCL, a cell core insulating layer CCO, and a cell capping pattern CCAP disposed inside the channel hole. The cell memory layer CML may extend along a surface of the channel hole. The cell channel layer CCL may extend along a surface of the cell memory layer CML. The cell core insulating layer CCO and the cell capping pattern CCAP may be disposed in a central area of the channel hole and may be surrounded by the cell channel layer CCL.

The cell memory layer CML may be divided into a first cell memory layer CML1 and a second cell memory layer CML2. The first cell memory layer CML1 may surround an upper portion and a middle portion of the cell plug CPL. The second cell memory layer CML2 may surround a lower portion of the cell plug CPL. The first cell memory layer CML1 may be disposed between the cell stack CST and the cell channel layer CCL, and may extend between the second source conductive layer 233A and the cell channel layer CCL. The second cell memory layer CML2 may be disposed between the first source conductive layer 231A and the cell channel layer CCL. The first and second cell memory layers CML1 and CML2 may be spaced apart from each other in the third direction D3. A portion of the interlayer source conductive layer 263 may be provided between the first cell memory layer CML1 and the second cell memory layer CML2. The portion of the interlayer source conductive layer 263 may be in contact with the cell channel layer CCL. The first and second cell memory layers CML1 and CML2 may be spaced apart from each other by the interlayer source conductive layer 263. Each of the first and second cell memory layers CML1 and CML2 may include a blocking insulating layer extending along the cell channel layer CCL, a data storage layer between the blocking insulating layer and the cell channel layer CCL, and a tunnel insulating layer between the data storage layer and the cell channel layer CCL. The cell capping pattern CCAP may be electrically connected to a bit line BL via a contact CT.

The plug PL may include a memory layer ML, a channel layer CL, and a core insulating layer CO. The plug PL may be disposed inside a hole that passes through the cell stack CST, the second source conductive layer 233A, and the interlayer source conductive layer 263 and extends into the first source conductive layer 231A. The memory layer ML may extend along a surface of the hole and may be separated into a first memory pattern ML1 and a second memory pattern ML2 by the interlayer source layer 263. The channel layer CL may extend along a surface of the memory layer ML and include a portion that is in contact with the interlayer source layer 263. The core insulating layer CO may be disposed in a central area of the hole. The gate isolation structure 251 described with reference to FIG. 2 may be formed of an insulating material and may extend into the plug PL.

The slit 261A may extend in the third direction D3 to pass through the cell stack CST and the second source conductive layer 233A. The slit 261A may pass through the cell etch stop pattern 235A. The slit 261A may extend in the second direction D2 as shown in FIG. 2.

The cell etch stop pattern 235A may remain on both sides of the slit 261A. The remaining cell etch stop pattern 235A may be disposed between the cell stack CST and the interlayer source layer 263.

The vertical structure 270 inside the slit 261A may extend into the cell source stack 260. The conductive source contact 273 of the vertical structure 270 may be connected to the interlayer source layer 263.

Referring to FIG. 3B, a plurality of source stacks 300B may be disposed in the second area. The plurality of source stacks 300B may be spaced apart from each other by a source isolation insulating layer SIL. A plurality of trenches 315T may be respectively formed in the plurality of source stacks 300B. A plurality of capacitor electrodes 235B may be inserted into the plurality of trenches 315T. As shown in FIG. 2, the source stack 300B and the capacitor electrode 235B may be formed in a line type extending in the first direction D1.

The source stack 300B may include a stack structure of a first source conductive layer 231B, a source sacrificial layer 303B, and a second source conductive layer 233B. Each of the first source conductive layer 231B and the second source conductive layer 233B may be a doped semiconductor layer and may include at least one of an n-type impurity and a p-type impurity. The source sacrificial layer 303B may include an undoped semiconductor layer. The source stack 300B may further include a first protective layer 301B between the first source conductive layer 231B and the source sacrificial layer 303B, and a second protective layer 305B between the source sacrificial layer 303B and the second source conductive layer 233B.

The second source conductive layer 233B of the source stack 300B may be penetrated by the trench 315T.

The stack ST may be disposed on the source stack 300B. The stack ST may include first insulating layers ISL1 and second insulating layers ISL2 alternately stacked on the source stack 300B. The first insulating layers ISL1 may be the same material as the interlayer insulating layers ILD as described above with reference to FIG. 3A.

The capacitor electrode 235B may be connected to the contact plug PCP. The contact plug PCP may extend in the third direction D3 to pass through the first insulating layers ISL1 and the second insulating layers ISL2. The contact plugs PCP may be electrically connected to an upper line 277 via the contact CT.

A process of forming a first structure F1 including the cell source stack 260 and the source stack 300B and a process of forming a second structure F2 including the cell stack CST and the stack ST are described with reference to the following drawings.

FIGS. 4A, 4B, 5A, 5B, 6A, 6B, 7, 8, 9, 10A, 10B, 11, 12, 13, and 14 are cross-sectional views illustrating a method of manufacturing a semiconductor memory device according to an embodiment of the present disclosure.

Figure 4A:
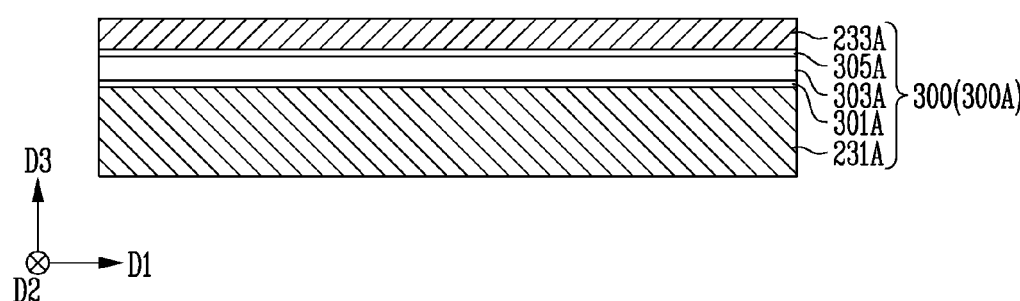
Figure 4B:
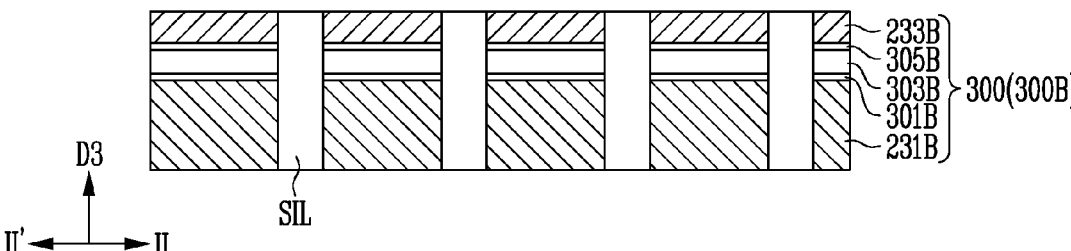

Referring to FIGS. 4A and 4B, a lower structure 300 may be formed. The lower structure 300 may include the first source conductive layers 231A and 231B, the source sacrificial layers 303A and 303B, and the second source conductive layers 233A and 233B stacked in the third direction D3. The lower structure 300 may further include the first protective layers 301A and 301B between the first source conductive layers 231A and 231B and the source sacrificial layers 303A and 303B, and the second protective layers 305A and 305B between the source sacrificial layers 303A and 303B and the second source conductive layers 233A and 233B.

The source sacrificial layers 303A and 303B may include a semiconductor material. As an embodiment, the source sacrificial layers 303A and 303B may include polysilicon. The first protective layers 301A and 301B and the second protective layers 305A and 305B may include a material having an etch selectivity with respect to the first source conductive layers 231A and 231B, the second source conductive layers 233A and 233B, and the source sacrificial layers 303A and 303B. As an embodiment, the first protective layers 301A and 301B and the second protective layers 305A and 305B may include an oxide.

Subsequently, the lower stack 300 may be divided into a preliminary cell source stack 300A and a plurality of source stacks 300B. The first source conductive layer 231A, the first protective layer 301A, the source sacrificial layer 303A, the second protective layer 305A, and the second source conductive layer 233A of the preliminary cell source stack 300A may be separated from the first source conductive layer 231B, the first protective layer 301B, the source sacrificial layer 303B, the second protective layer 305B, and the second source conductive layer 233B of the source stack 300B. The source isolation insulating layer SIL may be disposed between the plurality of source stacks 300B. The source isolation insulating layer SIL may be used as an insulator between the capacitor electrodes 235B described with reference to FIG. 3B.

Figure 5A:
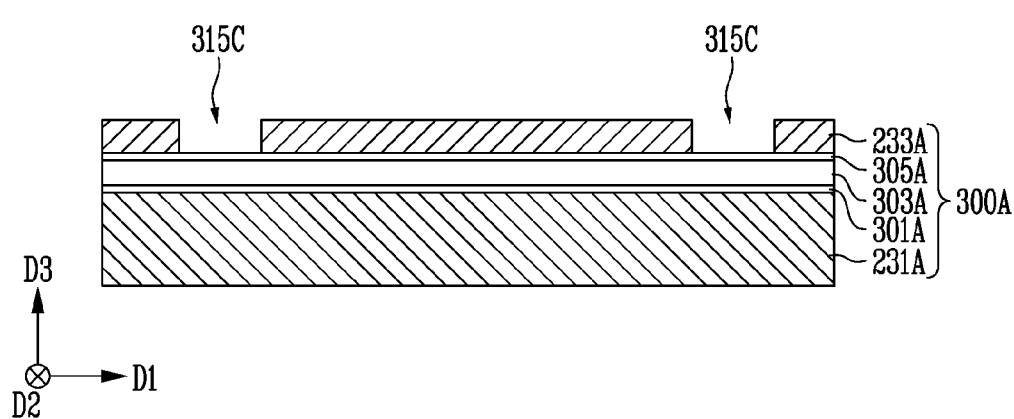
Figure 5B:
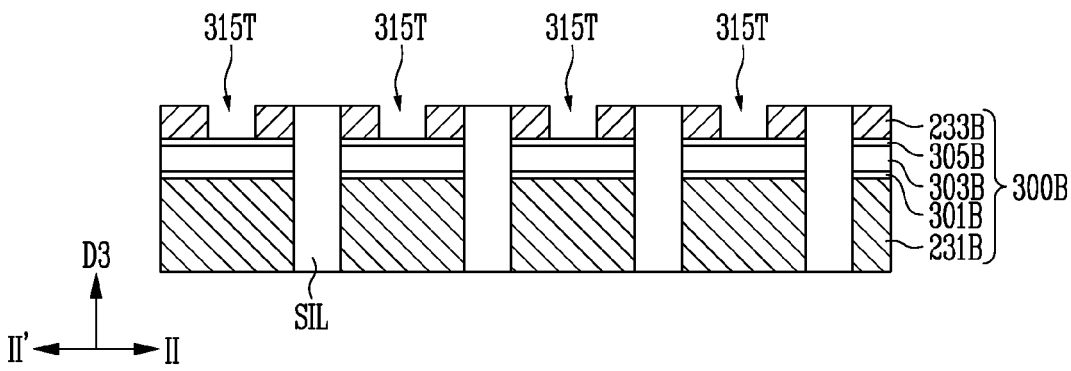

Referring to FIGS. 5A and 5B, the cell trench 315C passing through an upper portion of the preliminary cell source stack 300A may be formed. While forming the cell trench 315C, the trench 315T passing through an upper portion of the source stack 300B may be formed. As an embodiment, the cell trench 315C may be formed by passing through the second source conductive layer 233A of the preliminary cell source stack 300A. As an embodiment, the trench 315T may be formed by passing through the second source conductive layer 233B of the source stack 300B.

Figure 6A:
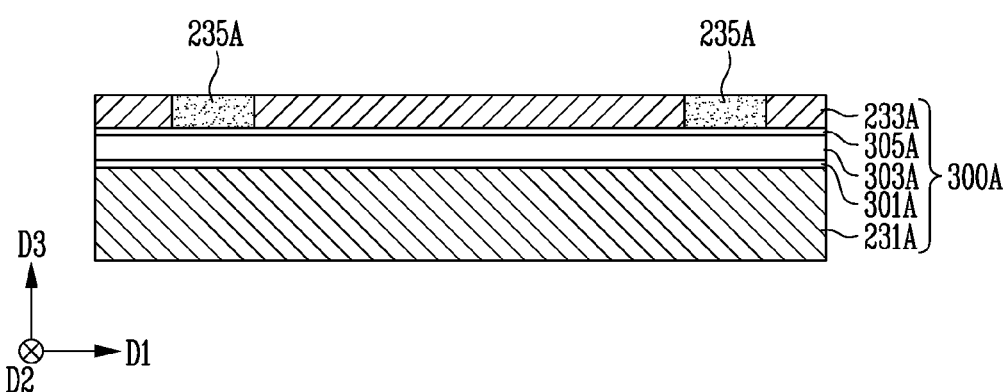
Figure 6B:
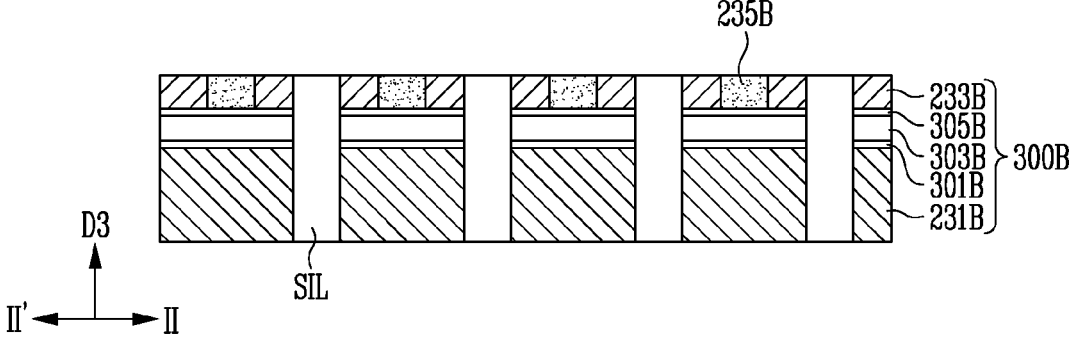

Referring to FIGS. 6A and 6B, the cell etch stop pattern 235A may be formed in the cell trench 315C. While forming the cell etch stop pattern 235A, the capacitor electrode 235B may be formed in the trench 315T. That is, the cell etch stop pattern 235A and the capacitor electrode 235B may be simultaneously formed. A material forming the cell etch stop pattern 235A and the capacitor electrode 235B may be different from the second source layers 233A and 233B. As an embodiment, an etch selectivity with respect to the plurality of first material layers 321 and the plurality of second material layers 323 shown in FIGS. 7 and 8 of the material forming the cell etch stop pattern 235A and the capacitor electrode 235B may be higher than the second source layers 233A and 233B. For example, the cell etch stop pattern 235A and the capacitor electrode 235B may include a metal layer. As an embodiment, the cell etch stop pattern 235A and the capacitor electrode 235B may include tungsten. In an embodiment, the metal layer of the capacitor electrode 235B may include tungsten.

Figure 7:
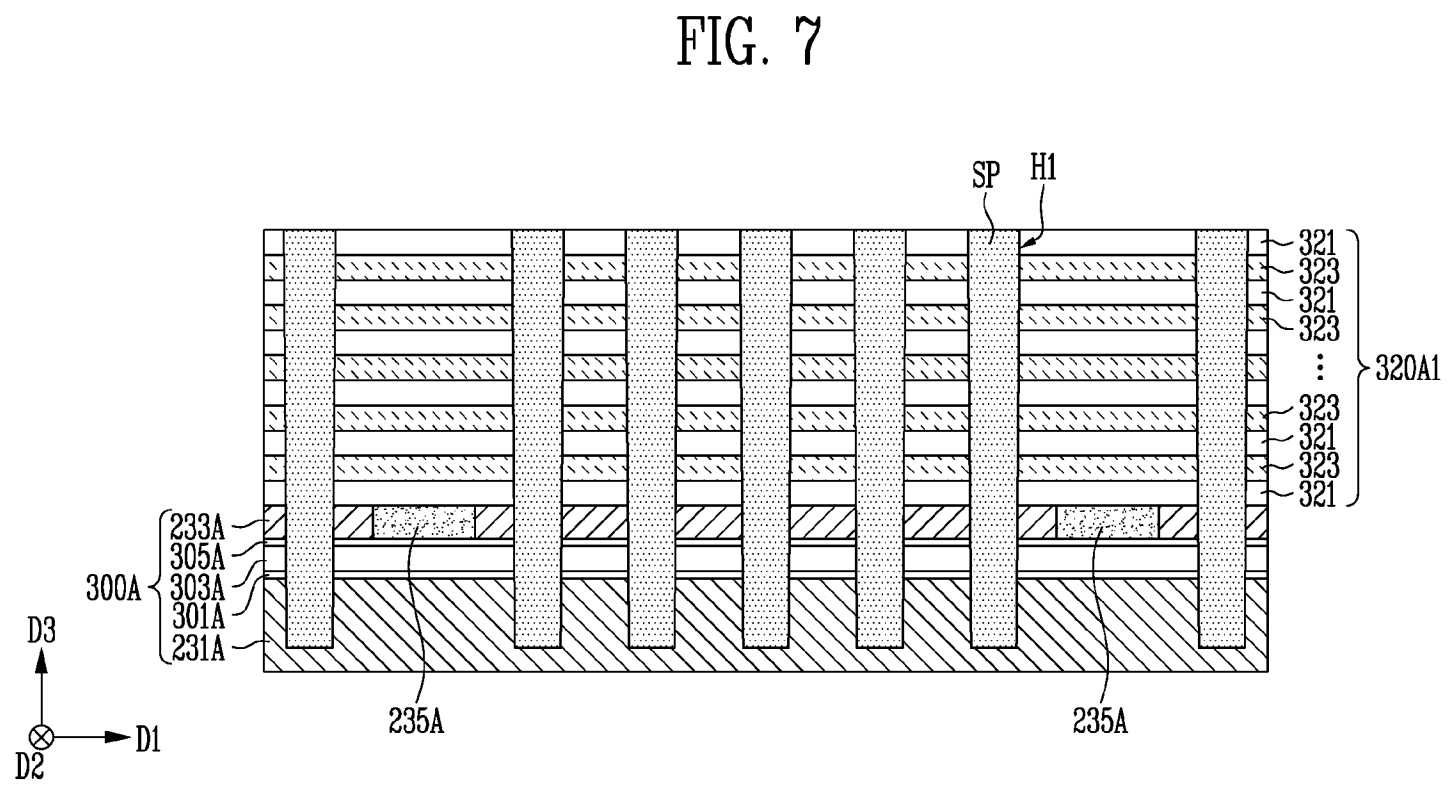
Figure 8:
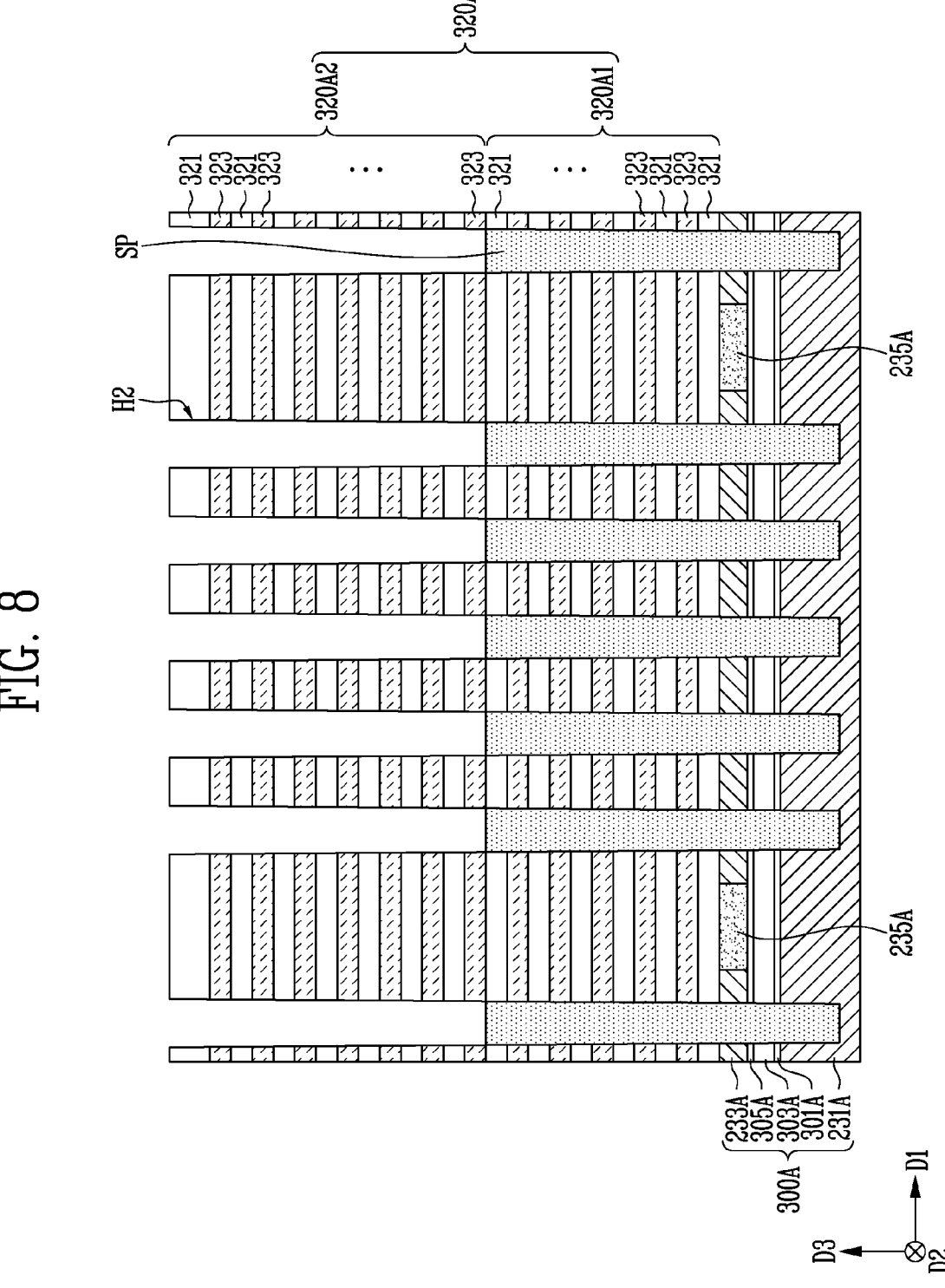

Referring to FIGS. 7 and 8, a preliminary cell stack 320A may be over the preliminary cell source stack 300A. The preliminary cell stack 320A may be formed by alternately stacking the plurality of first material layers 321 and the plurality of second material layers 323 in the third direction D3.

As an embodiment, the preliminary cell stack 320A may be stacked through two or more processes. For example, as shown in FIG. 7, after forming a first preliminary cell stack 320A1 configured of a portion of the plurality of first material layers 321 and a portion of the plurality of second material layers 323 on the preliminary cell source stack 300A as shown in FIG. 7, a second preliminary cell stack 320A2 configured of a remaining portion of the plurality of first material layers 321 and a remaining portion of the plurality of second material layers 323 may be over the first preliminary cell stack 321A1 as shown in FIG. 8. In this case, before forming a second preliminary cell stack 320A2, as shown in FIG. 7, a lower channel hole H1 passing through the first preliminary cell stack 320A1 and extending into the preliminary cell source stack 300A may be formed, and a sacrificial pillar SP filling the lower channel hole H1 may be formed. The sacrificial pillar SP and the lower channel hole H1 may pass through the second source conductive layer 233A on both sides of the cell etch stop pattern 235A and may extend into the first source conductive layer 231A. The sacrificial pillar SP may be formed of a material having an etch selectivity with respect to the first material layer 231 and the second material layer 323. As an embodiment, the sacrificial pillar SP may be formed of carbon, titanium nitride, tungsten, or the like.

Referring to FIG. 8, the second preliminary cell stack 320A2 may be disposed on the first preliminary cell stack 320A1 to cover the sacrificial pillar SP. After the second preliminary cell stack 320A2 is formed, a portion of the second preliminary cell stack 320A2 overlapping the sacrificial pillar SP may be etched to form an upper channel hole H2. The sacrificial pillar SP may be exposed by the upper channel hole H2.

Figure 9:
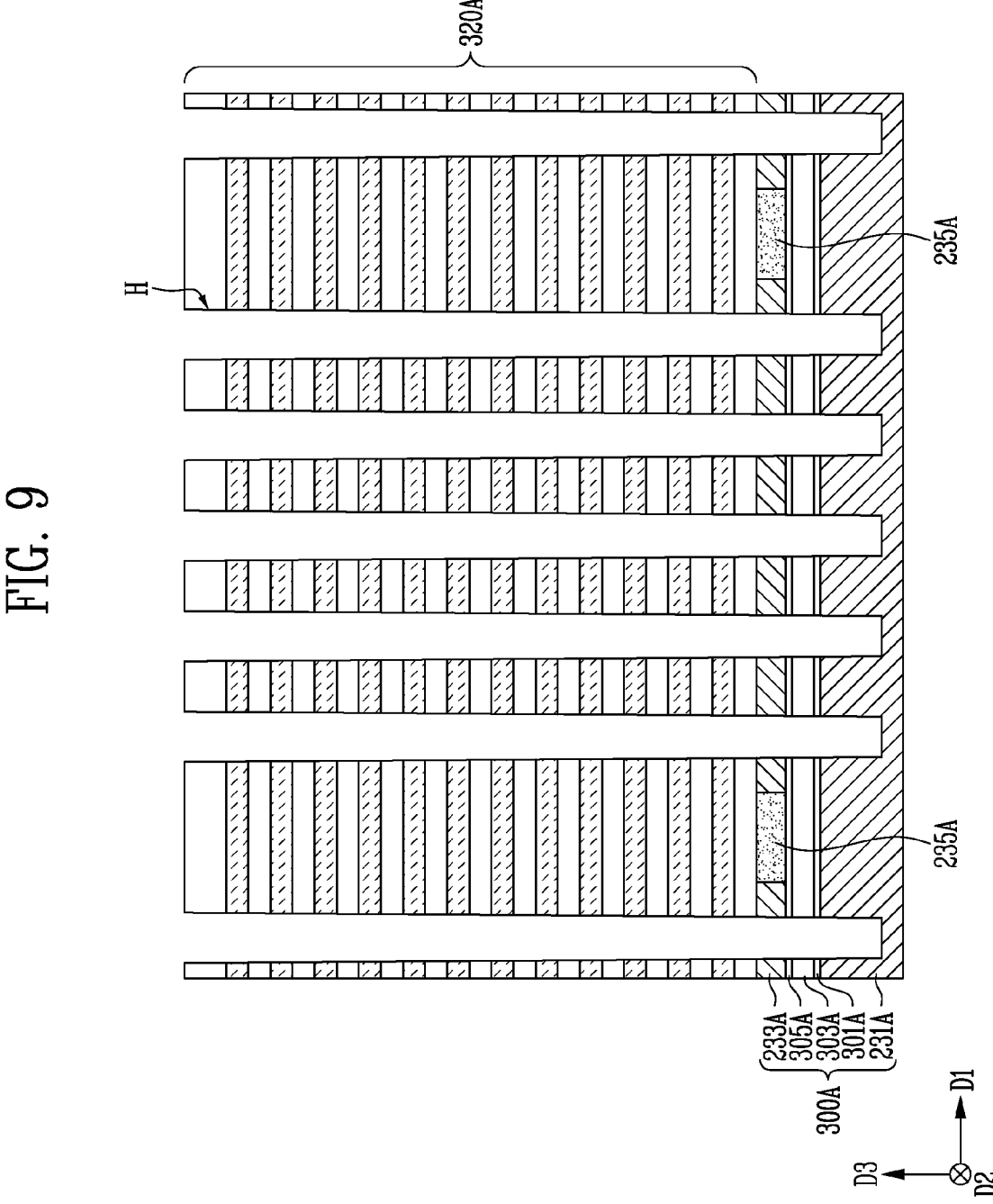

Referring to FIG. 9, the channel hole H may be opened by removing the sacrificial pillar SP through the upper channel hole H2 shown in FIG. 8. The channel hole H may be defined as a connection structure between the lower channel hole H1 shown in FIG. 7 and the upper channel hole H2 shown in FIG. 8. The channel hole H may pass through the preliminary cell stack 320A. The channel hole H may pass through the second source conductive layer 233A and the source sacrificial layer 303A of the preliminary cell source stack 300A. The channel hole H may extend into the first source conductive layer 231A of the preliminary cell source stack 300A.

Figure 10A:
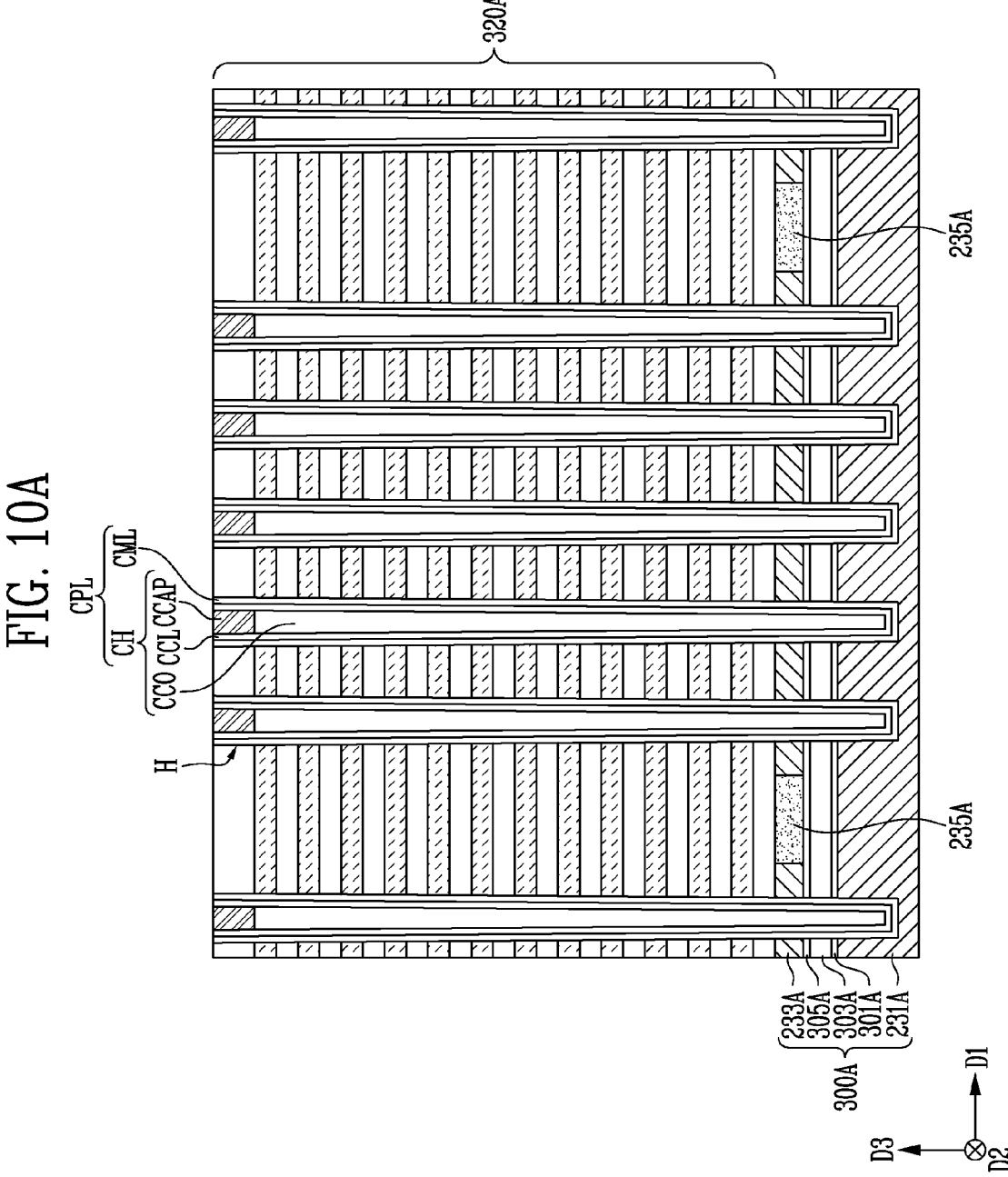

Referring to FIG. 10A, the cell memory layer CML and the channel structure CH may be formed in the channel hole H. The cell memory layer CML may be over a surface of the channel hole H. The channel structure CH may be over the cell memory layer CML. The channel structure CH may pass through the preliminary cell stack 320A, the second source conductive layer 233A, the second protective layer 305A, the source sacrificial layer 303A, and the first protective layer 301A, and may extend into the first source conductive layer 231A. The channel structure CH may extend in the third direction D3. A lowermost portion of the channel structure CH may be disposed in the first source conductive layer 231A. The cell memory layer CML may pass through the preliminary cell stack 320A, the second source conductive layer 233A, the second protective layer 305A, the source sacrificial layer 303A, and the first protective layer 301A, and may extend into the first source conductive layer 231A. The cell memory layer CML may extend in the third direction D3. A lowermost portion of the cell memory layer CML may be disposed in the first source conductive layer 231A.

The cell memory layer CML may include a tunnel insulating layer surrounding the channel structure CH, a data storage layer surrounding the tunnel insulating layer, and a blocking layer surrounding the data storage layer. The tunnel insulating layer may include a material capable of charge tunneling. The data storage layer may include a material capable of trapping a charge. A preliminary blocking layer may include a material capable of blocking a movement of a charge.

The channel structure CH may include the cell channel layer CCL, the cell core insulating layer CCO filling a central area of the channel structure CH, and the cell capping pattern CCAP disposed on the cell core insulating layer CCO.

The cell memory layer CML may be formed by sequentially stacking the blocking layer, the data storage layer, and the tunnel insulating layer in the channel hole H. Forming the channel structure CH may include forming the cell channel layer CCL on the cell memory layer CML, filling a central area of the channel hole H with the cell core insulating layer CCO, etching a portion of the insulating layer CCO to define a recess area in a portion of the central area of the channel hole H, and filling the recess area with the cell capping pattern CCAP.

The cell core insulating layer CCO may include an oxide, and the cell capping pattern CCAP may include a doped semiconductor layer. A conductivity type dopant inside the doped semiconductor layer may include an n-type dopant for a junction. The conductivity type dopant may include a counter-doped p-type dopant.

Figure 10B:
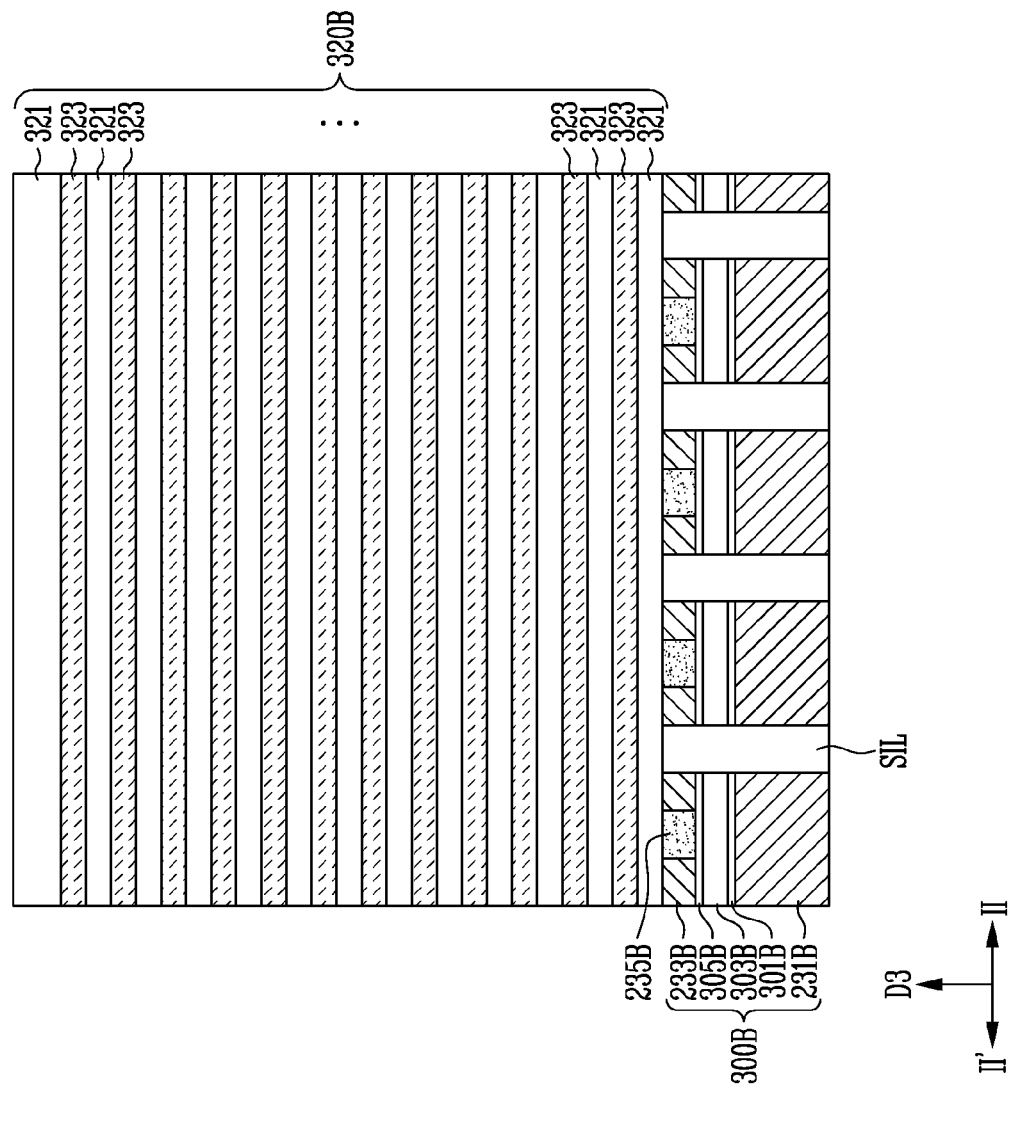

Referring to FIG. 10B, as described with reference to FIGS. 7 and 8, while the preliminary cell stack 320A is over the preliminary cell source stack 300A, the plurality of first material layers 321 and the plurality of second material layers 323 may also be deposited on the plurality of source stacks 300B. Accordingly, the preliminary cell stack 320A may overlap the plurality of source stacks 300B. This may be defined as the stack 320B including the first material layers 321 and the second material layers 323 on the source stacks 300B.

Figure 11:
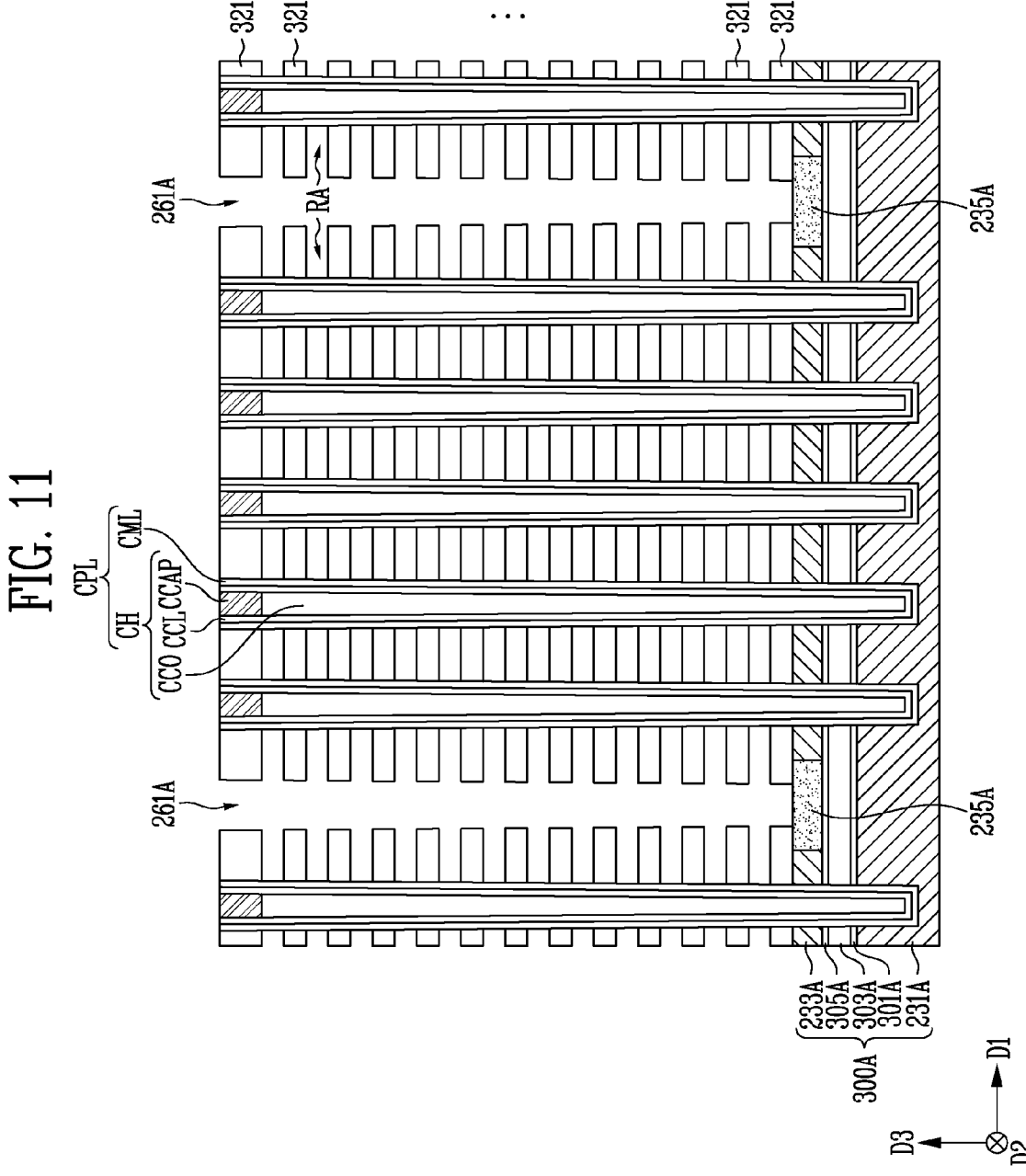

Referring to FIG. 11, a portion of the slit 261A passing through the preliminary cell stack 320A overlapping the preliminary cell source stack 300A and shown in FIG. 10A may be formed. The portion of the slit 261A may overlap the cell etch stop pattern 235A.

Since the cell etch stop pattern 235A may include a conductive material having an etch selectivity with respect to the first material layers 321 and the second material layers 323 higher than the second source conductive layer 233A of the preliminary cell source stack 300A, the cell etch stop pattern 235A may be used as an etch stop layer during an etching process of the preliminary cell stack 320A shown in FIG. 10A for forming the portion of the slit 261A. Accordingly, a phenomenon that the slit 261A is excessively deep may be improved.

The cell etch stop pattern 235A and the second material layers 323 shown in FIG. 10A may be exposed by the portion of the slit 261A. Subsequently, the second material layers 323 shown in FIG. 10A may be removed through the portion of the slit 261A. Accordingly, the recess areas RA may be opened between the first material layers 321 adjacent in the third direction D3.

Figure 12:
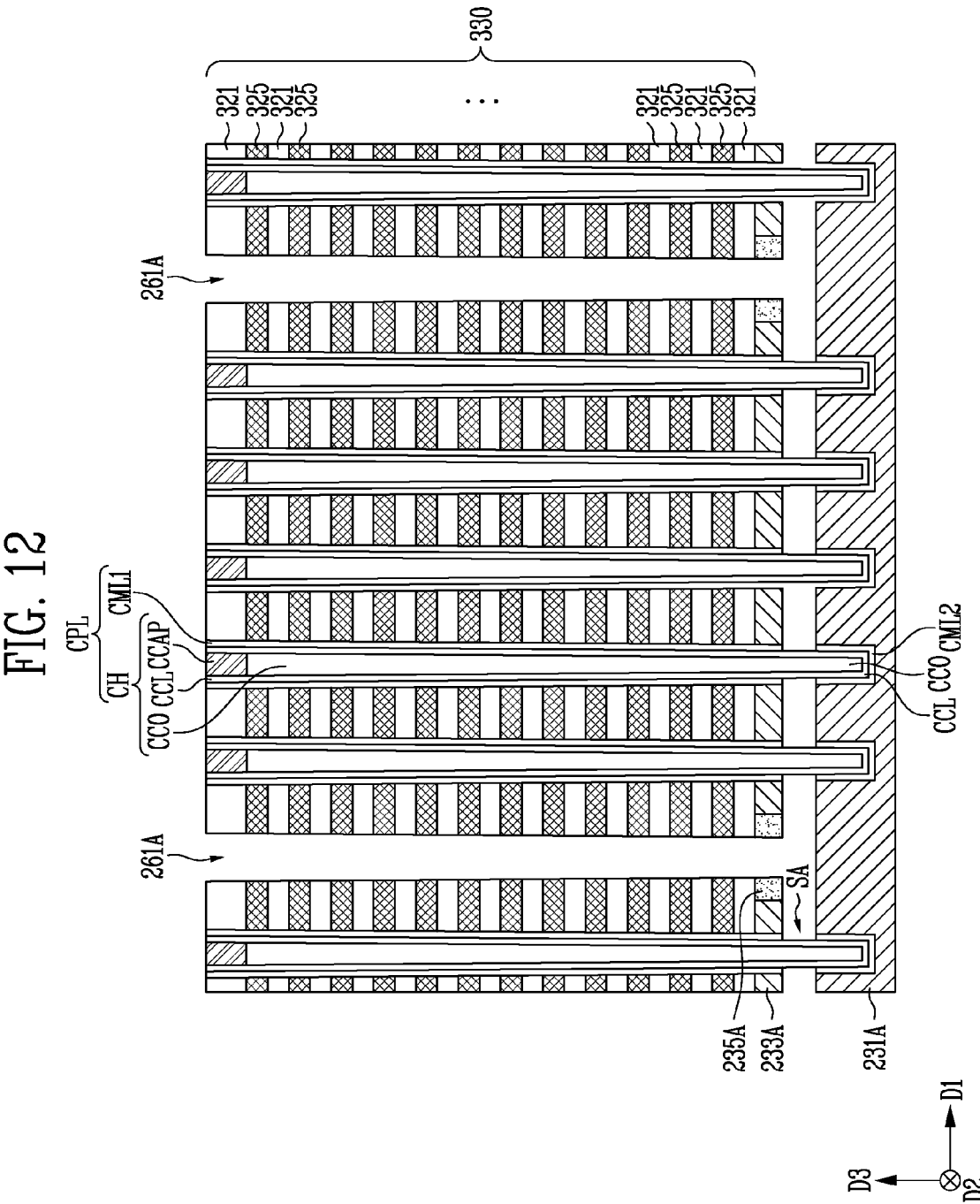

Referring to FIG. 12, the recess areas RA shown in FIG. 11 may be filled with third material layers 325. The remaining first material layers 321 may be defined as first insulating layers ISL1 as shown in FIG. 3B.

As described above with reference to FIGS. 11 and 12, by replacing the second material layers 323 with the third material layers 325 through the portion of the slit 261A, the cell stack 330 may be defined.

Subsequently, the cell etch stop pattern 235A may be etched to form a lower portion of the slit 261A. Accordingly, the slit 261A may be formed to a depth passing through the cell etch stop pattern 235A. The slit 261A may be formed to expose the source sacrificial layer 303A shown in FIG. 11. Thereafter, the source sacrificial layer 303A shown in FIG. 11 may be removed through the slit 261A. Removing the source sacrificial layer 303A may include injecting a material capable of etching the source sacrificial layer 303A through the slit 261A. While the source sacrificial layer 303A is removed, the first protective layer 301A and the second protective layer 305A shown in FIG. 11 may protect the first source conductive layer 231A and the second source conductive layer 233A. As an embodiment, while the source sacrificial layer 303A shown in FIG. 11 is removed, the first protective layer 301A and the second protective layer 305A may not be etched.

Thereafter, the cell channel layer CCL of the channel structure CH may be exposed, by removing a portion of the cell memory layer CML between the first source conductive layer 231A and the second source conductive layer 233A. Accordingly, the cell memory layer CML may be separated into the first cell memory layer CML1 and the second cell memory layer CML2. While a portion of the cell memory layer CML is removed, the first protective layer 301A and the second protective layer 305A shown in FIG. 11 may be removed.

As described above, since the source sacrificial layer 303A, the first protective layer 301A, and the second protective layer 305A shown in FIG. 11 may be removed and a portion of the cell memory layer CML is removed, a source area SA exposing the cell channel layer CCL may be defined between the first source conductive layer 231A and the second source conductive layer 233A.

Figure 13:
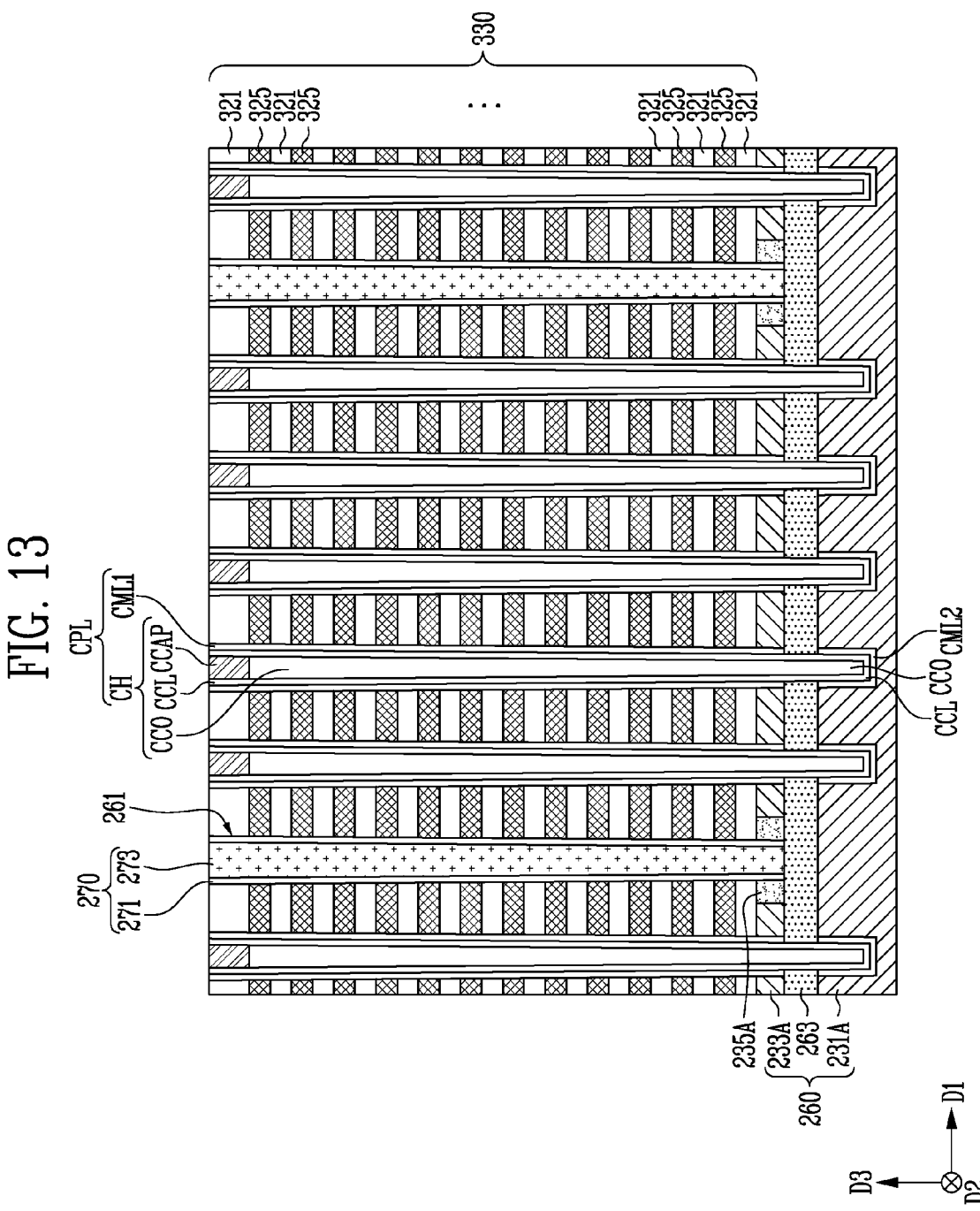

Referring to FIG. 13, the interlayer source conductive layer 263 may be formed in the source area SA shown in FIG. 12. As described with reference to FIGS. 12 and 13, by replacing the source sacrificial layer 303A, the first protective layer 301A, and the second protective layer 305A shown in FIG. 12 with the interlayer source layer 263, the cell source stack 260 including the first source conductive layer 231A, the interlayer source conductive layer 263, and the second source conductive layer 233A may be formed. The cell source stack 260 may be connected to the cell channel layer CCL through the interlayer source conductive layer 263.

After the cell stack CST and the cell source stack 260 are formed, the spacer insulating layer 271 may be over a sidewall of the slit 261A. Subsequently, the conductive source contact 273 filling the slit 261A may be formed. The conductive source contact 273 may be disposed on the spacer insulating layer 271, and may be insulated from the third material layer 325 of the cell stack CST by the spacer insulating layer 271.

Figure 14:
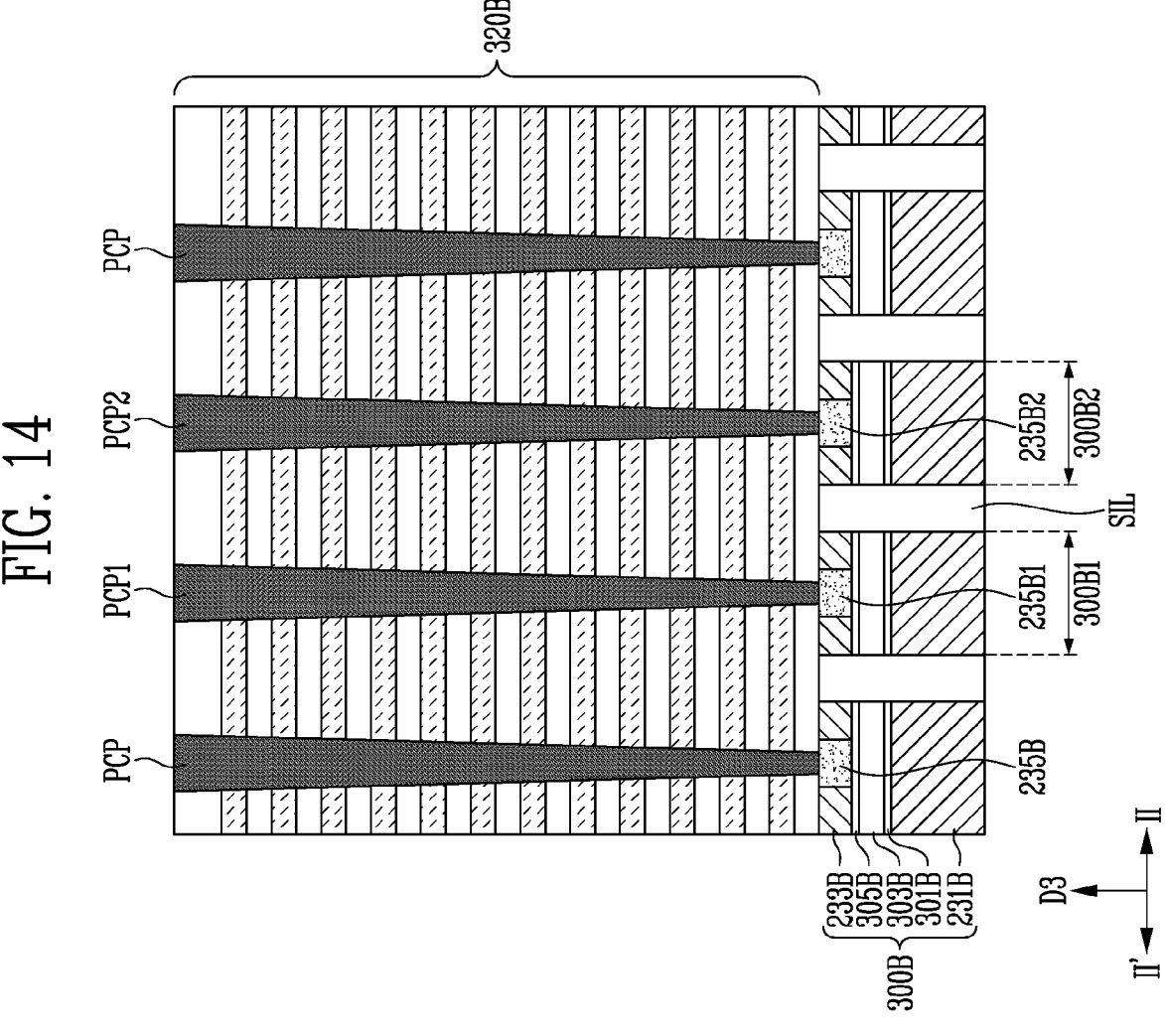

Referring to FIG. 14, the stack 320B on the source stack 300B may be protected while the processes described with reference to FIGS. 11 to 13 are performed.

The stack 320B on the source stack 300B may be penetrated by the contact plugs PCP. The contact plugs PCP may be connected to the capacitor electrodes 235B.

After the process described with reference to FIGS. 13 and 14 is performed, subsequent processes for forming the contacts CT, the bit line BL, and the upper line 277 shown in FIGS. 3A and 3B may be performed.

Figure 15:
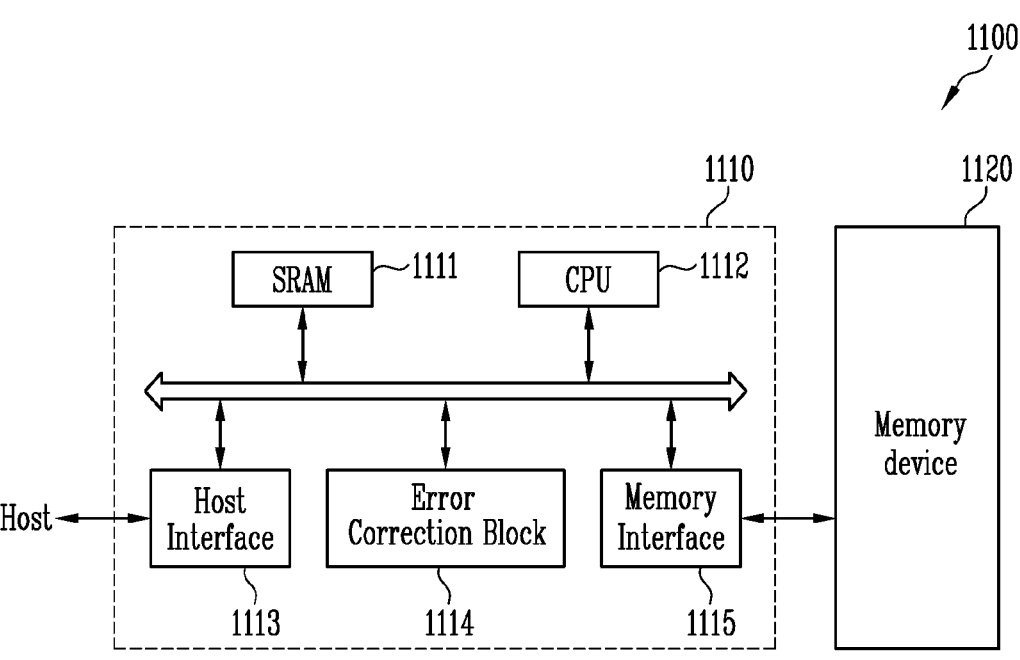
FIG. 15 is a block diagram illustrating a configuration of a memory system according to an embodiment of the present disclosure.

FIG. 15 is a block diagram illustrating a configuration of a memory system according to an embodiment of the present disclosure.

Referring to FIG. 15, the memory system 1100 includes a memory device 1120 and a memory controller 1110.

The memory device 1120 may be a multi-chip package configured of a plurality of flash memory chips.

The memory controller 1110 may be configured to control the memory device 1120, and may include a static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 include a data exchange protocol of a host connected to the memory system 1100. The error correction block 1114 detects an error included in data read from the memory device 1120 and corrects the detected error. The memory interface 1115 performs interfacing with the memory device 1120. The memory controller 1110 may further include a read only memory (ROM) that stores code data for interfacing with the host.

The above-described memory system 1100 may be a memory card or a solid state drive (SSD) in which the memory device 1120 and the memory controller 1110 are combined. For example, when the memory system 1100 is the SSD, the memory controller 1110 may communicate with the outside (for example, the host) through one of various interface protocols such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 16:
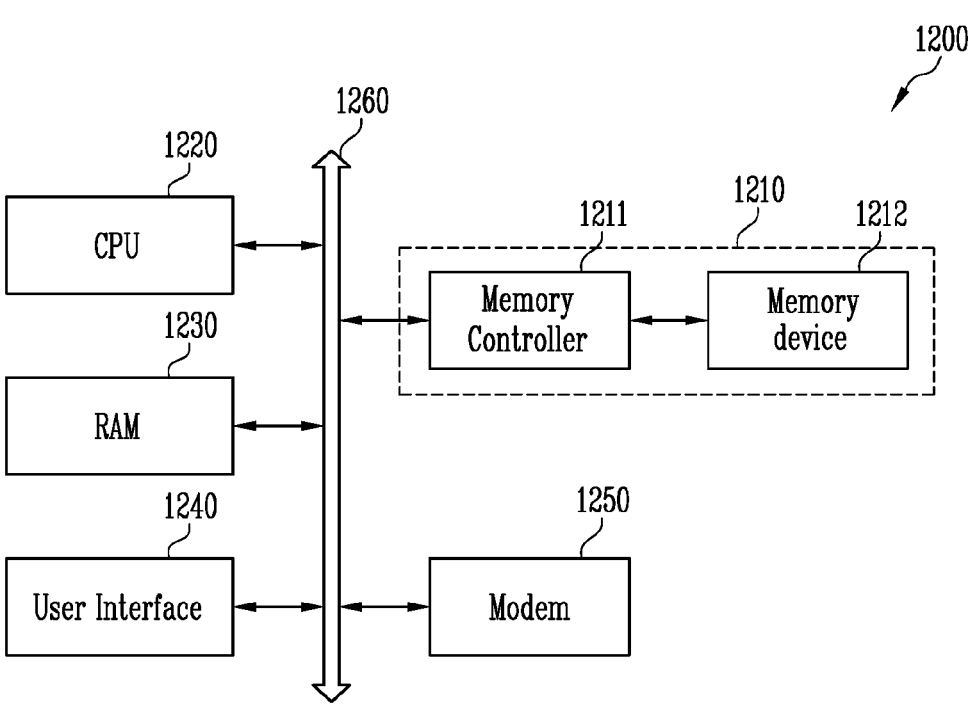
FIG. 16 is a block diagram illustrating a configuration of a computing system according to an embodiment.

FIG. 16 is a block diagram illustrating a configuration of a computing system according to an embodiment of the present disclosure.

Referring to FIG. 16, the computing system 1200 may include a CPU 1220, a random access memory (RAM) 1230, a user interface 1240, a modem 1250, and a memory system 1210 electrically connected to a system bus 1260. When the computing system 1200 is a mobile device, a battery for supplying an operation voltage to the computing system 1200 may be further included, and an application chipset, an image processor, a mobile DRAM, and the like may be further included.

The memory system 1210 may include a memory device 1212 and a memory controller 1211.

The memory controller 1211 may be configured identically to the memory controller 1110 described above with reference to FIG. 15.

What is claimed is:

1. A semiconductor memory device comprising:
    a source stack including an upper portion through which a trench passes;
    a capacitor electrode including a metal layer disposed in the trench;
    a stack including first insulating layers and second insulating layers alternately stacked on the source stack; and
    a contact plug passing through the stack and extending to be connected to the metal layer.

2. The semiconductor memory device of claim 1, wherein the source stack comprises:
    a first source conductive layer; and
    a second source conductive layer over the first source conductive layer.

3. The semiconductor memory device of claim 2, wherein the source stack further comprises:
    a first protective layer over the first source conductive layer;
    a source sacrificial layer over the first protective layer; and
    a second protective layer over the source sacrificial layer.

4. The semiconductor memory device of claim 2, wherein the metal layer is disposed between the first source conductive layer and the stack, and wherein each of the metal layer and the trench passes through the second source conductive layer.

5. The semiconductor memory device of claim 1, wherein the metal layer includes tungsten.

6. The semiconductor memory device of claim 1, further comprising:
    a cell source stack spaced apart from the source stack and including an upper portion through which a cell trench passes;
    a cell etch stop pattern disposed in the cell trench;
    a cell stack including interlayer insulating layers and conductive layers alternately stacked on the cell source stack; and
    a cell plug passing through the cell stack,
    wherein the cell source stack is disposed at a level at which the source stack is disposed,
    the cell stack is disposed at a level at which the stack is disposed, and the cell etch stop pattern is disposed at a level at which the metal layer is disposed.

7. The semiconductor memory device of claim 6, wherein the cell source stack comprises:

a first source conductive layer; and a second source conductive layer over the first source conductive layer.

8. The semiconductor memory device of claim 7, wherein the cell plug comprises:

a cell channel layer passing through the cell stack and the second source conductive layer and extending into the first source conductive layer; and a first cell memory layer disposed between a sidewall of the cell stack and a sidewall of the cell channel layer.

9. The semiconductor memory device of claim 7, wherein the cell etch stop pattern is disposed between the first source conductive layer of the cell source stack and the cell stack, and wherein each of the cell etch stop pattern and the cell trench passes through the second source conductive layer.

10. The semiconductor memory device of claim 7, wherein the cell source stack comprises:

an interlayer source conductive layer over the first source conductive layer between the first and second source conductive layers.

11. The semiconductor memory device of claim 10, wherein the cell plug further comprises:

a second cell memory layer disposed between the first source conductive layer and the cell channel layer, wherein the first cell memory layer is disposed between the second source conductive layer and the cell channel layer, and wherein the second cell memory layer is spaced apart from the first cell memory layer.

12. A semiconductor memory device comprising:

a first structure including a cell source stack and a source stack disposed on the same level and formed in different stack structures;

a second structure including a cell stack and a stack spaced apart from each other, and disposed on the first structure;

a capacitor electrode including a metal layer passing through a portion of the source stack; and a contact plug passing through the stack and electrically connected to the metal layer.

13. The semiconductor memory device of claim 12, wherein the source stack comprises:

a first source conductive layer;

a first protective layer over the first source conductive layer;

a source sacrificial layer over the first protective layer;

a second protective layer over the source sacrificial layer; and a second source conductive layer disposed on the second protective layer.

14. The semiconductor memory device of claim 12, further comprising:

a cell etch stop pattern passing through a portion of the cell source stack; and a cell plug passing through the cell stack.

15. A semiconductor memory device comprising:

an interlayer source conductive layer;

a second source conductive layer disposed on the interlayer source conductive layer;

a cell etch stop pattern passing through the second source conductive layer;

a cell stack including conductive layers and interlayer insulating layers alternately disposed on the second source conductive layer;

a slit passing through the cell stack and the cell etch stop pattern;

a first capacitor electrode and a second capacitor electrode disposed on the same level as the cell etch stop pattern, the first capacitor electrode spaced apart from the second capacitor electrode;

a stack including first insulating layers and second insulating layers alternately disposed on the first capacitor electrode and the second capacitor electrode; and a first contact plug and a second contact plug passing through the stack and respectively connected to the first capacitor electrode and the second capacitor electrode.

16. The semiconductor memory device of claim 15, wherein the cell etch stop pattern, the first capacitor electrode, and the second capacitor electrode include a metal layer.

17. The semiconductor memory device of claim 15, further comprising:

a first source stack in which a first trench into which the first capacitor electrode is inserted is defined;

a second source stack in which a second trench into which the second capacitor electrode is inserted is defined; and a source isolation insulating layer disposed between the first source stack and the second source stack.

18. The semiconductor memory device of claim 16, wherein the metal layer includes tungsten.

19. The semiconductor memory device of claim 16, wherein each of the first source stack and the second source stack comprises:

a source sacrificial layer;

a second protective layer on the source sacrificial layer; and a second source conductive layer on the protective layer.

20. The semiconductor memory device of claim 19, wherein the second source conductive layer is penetrated by a trench corresponding thereto among the first trench and the second trench.

* * * * *